US009013187B2

(12) United States Patent
Stormont

(10) Patent No.: US 9,013,187 B2
(45) Date of Patent: Apr. 21, 2015

(54) BALANCED MIXER FOR MRI SYSTEM WITH A HUB, INTERMEDIATE FREQUENCY, OSCILLATOR, AND PRE-AMP CIRCUITRY COUPLED TOGETHER

(75) Inventor: Robert Steven Stormont, Hartland, WI (US)

(73) Assignee: General Electric Company, Schenectady, NY (US)

( * ) Notice: Subject to any disclaimer, the term of this patent is extended or adjusted under 35 U.S.C. 154(b) by 974 days.

(21) Appl. No.: 13/161,657

(22) Filed: Jun. 16, 2011

(65) Prior Publication Data
US 2012/0319688 A1 Dec. 20, 2012

(51) Int. Cl.
G01R 33/44 (2006.01)
H01F 7/06 (2006.01)

(52) U.S. Cl.
CPC . *G01R 33/44* (2013.01); *H01F 7/06* (2013.01)

(58) Field of Classification Search
USPC ........................ 324/300–322; 600/407–435; 382/128–131; 29/602.1
See application file for complete search history.

(56) References Cited

U.S. PATENT DOCUMENTS

| | | | | | |
|---|---|---|---|---|---|
| 4,694,254 | A | * | 9/1987 | Vatis et al. | 324/309 |
| 5,218,185 | A | * | 6/1993 | Gross | 219/528 |
| 5,678,548 | A | * | 10/1997 | Murugesan et al. | 600/413 |
| 5,828,216 | A | * | 10/1998 | Tschudin et al. | 324/322 |
| 5,928,145 | A | * | 7/1999 | Ocali et al. | 600/410 |
| 6,154,031 | A | * | 11/2000 | Hughes | 324/322 |
| 6,201,395 | B1 | * | 3/2001 | Stanley | 324/322 |
| 6,323,649 | B1 | * | 11/2001 | Pace et al. | 324/322 |
| 6,900,638 | B1 | * | 5/2005 | Yair et al. | 324/322 |
| 7,116,166 | B2 | * | 10/2006 | Sabate et al. | 330/146 |
| 7,449,886 | B2 | * | 11/2008 | Buchwald | 324/311 |
| 7,652,476 | B2 | * | 1/2010 | de Rooij et al. | 324/322 |
| 7,884,609 | B2 | * | 2/2011 | Soutome et al. | 324/322 |
| 8,193,810 | B2 | * | 6/2012 | Otake et al. | 324/318 |
| 8,324,901 | B2 | * | 12/2012 | Hulbert et al. | 324/322 |
| 8,547,102 | B2 | * | 10/2013 | Nozaki | 324/322 |
| 2005/0275404 | A1 | * | 12/2005 | Sabate et al. | 324/322 |
| 2006/0103386 | A1 | * | 5/2006 | Buchwald | 324/322 |
| 2009/0012387 | A1 | * | 1/2009 | Hanson et al. | 600/411 |
| 2009/0286478 | A1 | | 11/2009 | Biber et al. | |
| 2010/0253354 | A1 | * | 10/2010 | Hulbert et al. | 324/322 |
| 2011/0037471 | A1 | * | 2/2011 | Nozaki | 324/322 |
| 2011/0187369 | A1 | * | 8/2011 | Rivas Davila et al. | 324/318 |
| 2012/0319688 | A1 | * | 12/2012 | Stormont | 324/322 |

* cited by examiner

*Primary Examiner* — Melissa Koval
*Assistant Examiner* — Tiffany Fetzner
(74) *Attorney, Agent, or Firm* — Ziolkowski Patent Solutions Group, SC

(57) ABSTRACT

A magnetic resonance imaging (MRI) apparatus includes an RF coil, a preamplifier module, and a hub coupled to the preamplifier module via a transmission line. The preamplifier module includes an amplifier configured to amplify a magnitude of a first signal from the RF coil, the first signal having a first frequency and a diode array coupled to the amplifier. The MRI apparatus also includes an intermediate frequency (IF) circuit coupled to the transmission line and an oscillator circuit coupled to the hub and configured to supply an oscillating signal to the diode array via the transmission line to cause the diode array to mix the oscillating signal with the first signal to generate an IF signal to be received by the IF circuit via the transmission line, wherein the IF signal has a second frequency that is lower than the first frequency.

20 Claims, 4 Drawing Sheets

BALANCED MIXER FOR MRI SYSTEM WITH A HUB, INTERMEDIATE FREQUENCY, OSCILLATOR, AND PRE-AMP CIRCUITRY COUPLED TOGETHER

BACKGROUND OF THE INVENTION

Embodiments of the invention relate generally to an MR system and, more particularly, to a balanced mixer for transmitting signals acquired by local RF coils to the MR system for processing.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals is digitized and processed to reconstruct the image using one of many well known reconstruction techniques.

Generally, the RF coil assembly of an MRI system includes a receive coil used in conjunction with a transmit coil to detect or receive the signals from the excited spins in an imaged object. Typically, each receive coil of the RF coil assembly, also known as a "local coil", is connected to the receive chain of the MRI system via a coaxial transmission line or cable. Additionally, the receive coils of the RF coil assembly are typically supplied power through the coaxial cables. As the number of receive coils increases, the number of coaxial cables increases to match; thus, a large bundle of coaxial cables results that can become uncomfortable for an imaging patient when laid across the patient and difficult to manage or maneuver.

Further, the connection lines used for transmission are generally directed within a movable patient bed and are therefore several meters in length. Interactions such as parallel resonance and parasitic capacitance between the transmit coil and the coaxial cables can cause standing waves and induced current in the coaxial cables. Current induced in the coaxial cables can cause the coaxial cables to become extremely heated, which furthers patient uncomfortability. To avoid such heat generations, low-attenuation cables may be used for transmission, but these can have large cable diameters, thus resulting in cables that are unwieldy. In addition, large, multi-coaxial connectors that are used to offer means for connecting and disconnecting sections of a multi-cable bundle can be costly and unwieldy in use for the operating personnel.

It would therefore be desirable to have an apparatus and method capable of simplifying the transfer of received MR signals from a local RF coil to the signal processing system of an MRI system.

BRIEF DESCRIPTION OF THE INVENTION

In accordance with one aspect of the invention, a magnetic resonance imaging (MRI) apparatus includes an RF coil, a preamplifier module, and a hub coupled to the preamplifier module via a transmission line. The preamplifier module includes an amplifier configured to amplify a magnitude of a first signal from the RF coil, the first signal having a first frequency and a diode array coupled to the amplifier. The MRI apparatus also includes an intermediate frequency (IF) circuit coupled to the transmission line and an oscillator circuit coupled to the hub and configured to supply an oscillating signal to the diode array via the transmission line to cause the diode array to mix the oscillating signal with the first signal to generate an IF signal to be received by the IF circuit via the transmission line, wherein the IF signal has a second frequency that is lower than the first frequency.

According to another aspect of the invention, a method of manufacturing a balanced mixer for an MRI system includes forming an RF preamplifier module comprising an RF amplifier and a diode array, coupling the RF amplifier to an RF coil, the RF amplifier configured to amplify a magnitude of a signal having a first frequency from the RF coil, and coupling the diode array coupled to the amplifier. The method also includes coupling a transmission line to the RF preamplifier module and coupling a hub to the transmission line. The method further includes coupling an oscillator circuit to the hub and coupling an intermediate frequency (IF) circuit to the transmission line. The IF circuit is configured to receive the IF signal. the oscillator circuit configured to supply an oscillating signal to the diode array via the transmission line to cause the diode array to mix the oscillating signal with the first signal to generate an IF signal having a second frequency that is lower than the first frequency.

According to yet another aspect of the invention, a magnetic resonance imaging (MRI) system includes a plurality of gradient coils positioned about a bore of a magnet, an RF coil assembly comprising a plurality of RF coils, a pulse module, and an RF transceiver system and an RF switch controlled by the pulse module to transmit RF signals to an RF coil assembly to acquire MR images. The MRI system further includes a preamplifier module coupled to the RF coil assembly and a transmission line coupled to the preamplifier module at a first end thereof and coupled to a hub at a second end thereof. The preamplifier module includes an amplifier configured to amplify a signal from the RF coil assembly and a diode array coupled to receive the amplified signal from the amplifier. The MRI system also includes an intermediate frequency (IF) circuit coupled to the transmission line and an oscillator circuit coupled to the transmission line and configured to supply an oscillating signal to the diode array via the transmission line to cause the diode array to mix the oscillating signal with the amplified signal to generate an IF signal to be received by the IF circuit via the transmission line, wherein the IF signal has a frequency that is lower than the amplified frequency.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION

Figure 1:
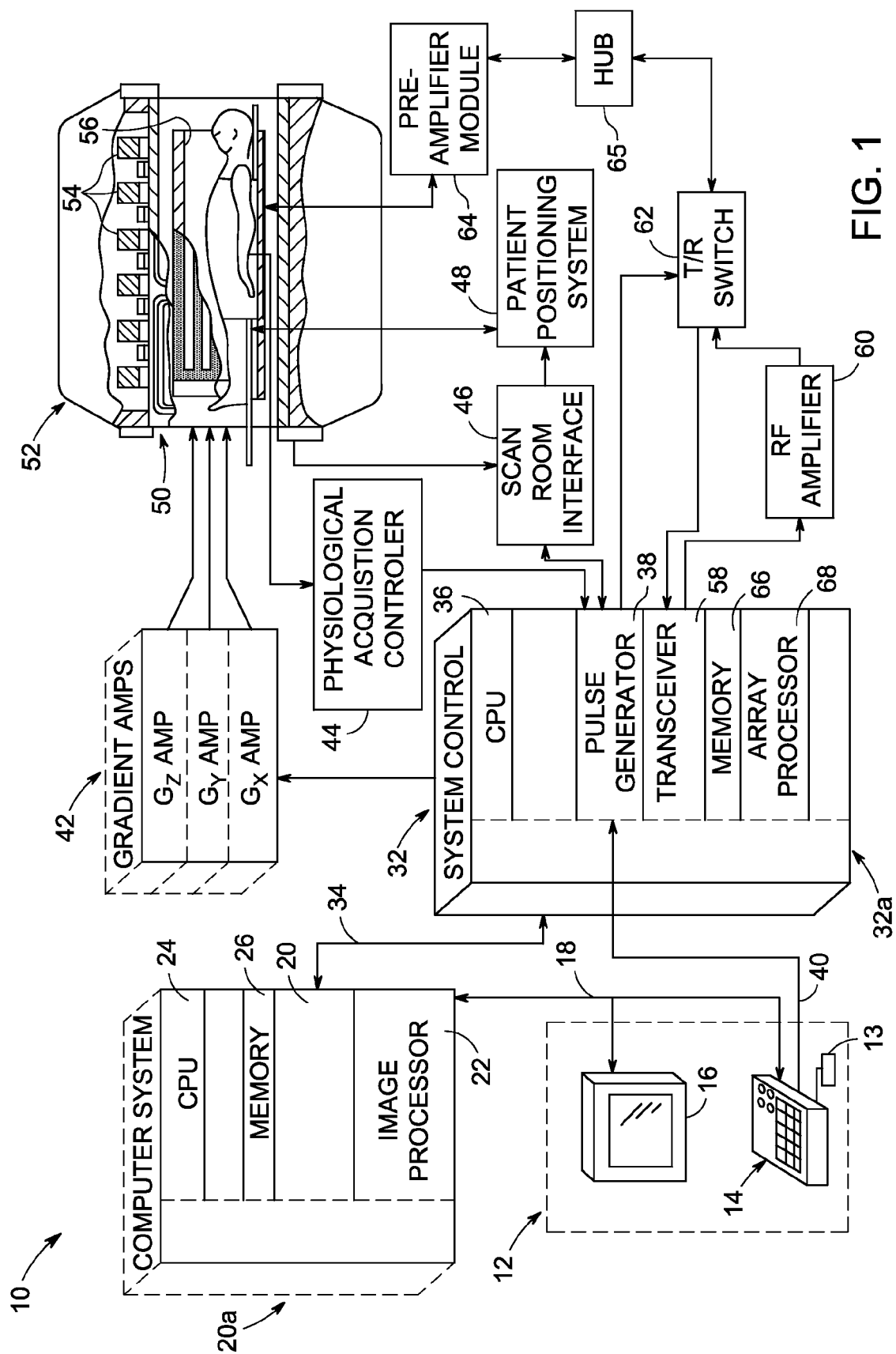
FIG. 1 is a schematic block diagram of an exemplary MR imaging system incorporating an embodiment of the invention.

Referring to FIG. 1, the major components of a magnetic resonance imaging (MRI) system 10 incorporating an embodiment of the invention are shown. The operation of the system is controlled for certain functions from an operator console 12 which in this example includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These modules include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, card reader, push-button, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled to a pre-amplifier module 64. The amplified MR signals are filtered and mixed with a local oscillator signal supplied via a hub 65 to pre-amplifier module 64, and a resulting intermediate frequency signal is digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12 or as otherwise directed by the system software, this image data may be archived in long term storage or it may be further processed by the image processor 22 and conveyed to the operator console 12 and presented on the display 16.

Figure 2:
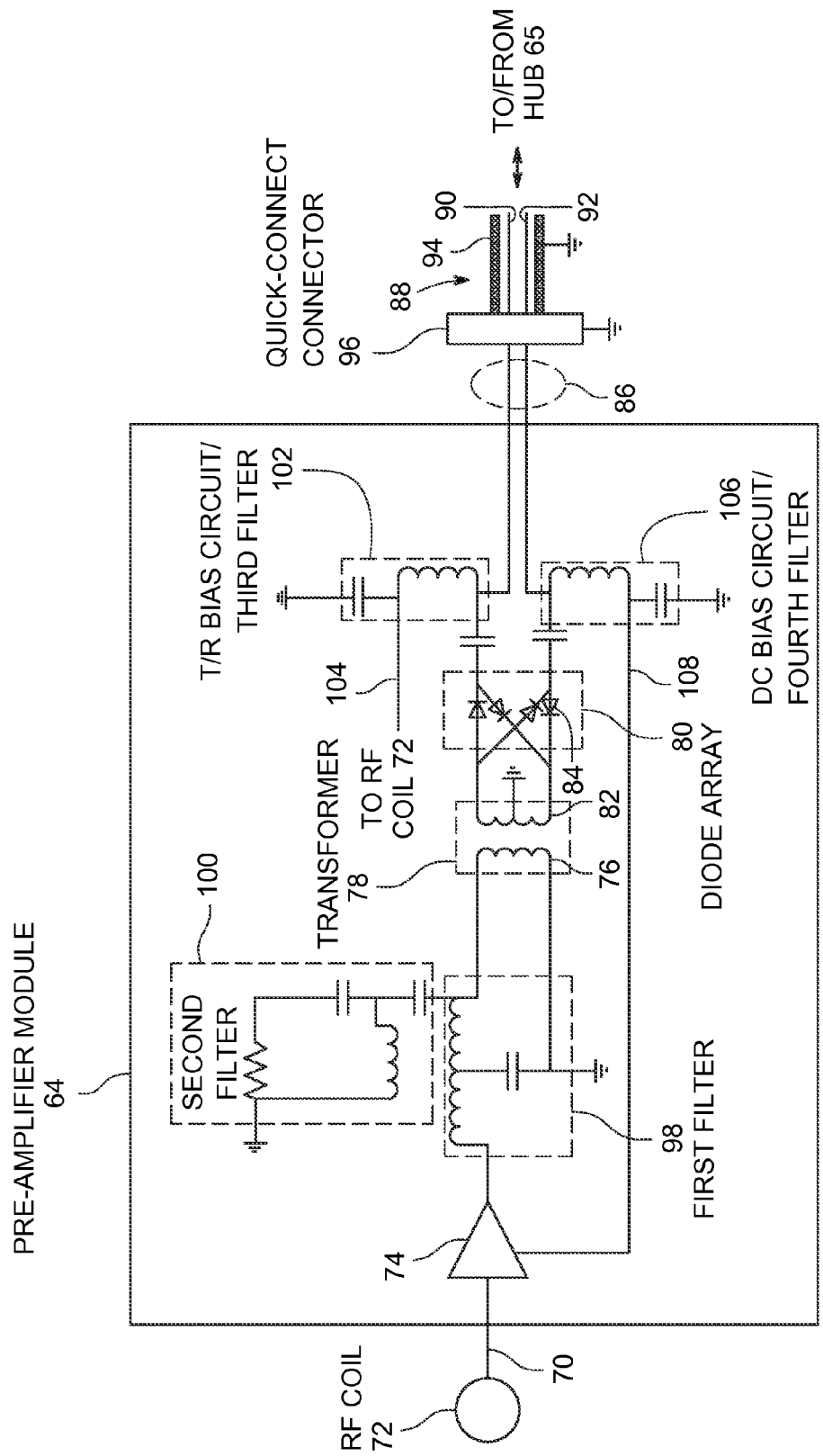
FIG. 2 is a block schematic diagram of pre-amplifier module 64 of FIG. 1 according to an embodiment of the invention.

FIG. 2 shows a block schematic diagram of pre-amplifier module 64 of FIG. 1 according to an embodiment of the invention. Pre-amplifier module 64 includes an input 70 configured to receive RF signals from an RF coil 72 during an MR scan. The RF signals are amplified by an amplifier 74 and fed to a first winding 76 of a transformer 78. RF coil 72 may be one coil of a plurality of coils used to acquire MR signals. It is contemplated that each of the plurality of coils may have a dedicated pre-amplifier module 64 as described herein coupled thereto.

A diode array 80 coupled to a second winding 82 of transformer 78 includes a plurality of diodes 84 arranged in a bridge configuration that forms a balanced diode passive mixer together with a local oscillator (LO) signal received via a common pre-amplifier module input/output 86 coupled to a transmission line 88. In one embodiment, transmission line 88 includes a twisted pair of signal lines 90, 92 shielded by a grounded shield 94. A quick-connect connector 96 may be used to couple or decouple pre-amplifier module 64 to or from transmission line 88.

Pre-amplifier module 64 includes a first filter 98 combining, in one embodiment, inductance and capacitance to pass the frequency of the amplified RF signals. In addition, filter 98 is configured to block the frequency of the LO signal and to reject other frequencies resulting from mixing the RF signals with the LO signals. In a 1.5 Tesla MR system, for example, filter 98 may be configured to pass the RF signal frequency of approximately 64 MHz, to block a LO signal frequency of approximately 80 MHz, and to reject a frequency of approximately 96 MHz, which is the image frequency which would convert to the same IF frequency as 64 MHz. A second filter 100 is configured to terminate the LO signal frequency using resistance, capacitance, and inductance. In the example above, second filter 100 may be configured to terminate approximately 80 MHz. The example frequencies used in the examples herein are not the only frequencies that may be used or affected, and it is contemplated that embodiments of the invention may be used with other frequency values.

In addition to carrying a portion of the LO signal, signal line 90 of transmission line 88 is also configured to transmit a transmit/receive (T/R) signal to pre-amplifier module 64 from T/R switch 62 of FIG. 1. Signal line 90 is coupled to a T/R bias circuit or third filter 102 of pre-amplifier module 64 configured to extract the T/R signal from signal line 90. An output 104 of third filter 102 is coupled to RF coil 72 to deliver the T/R signal thereto. The T/R signal may, for example, cause RF coil 72 to become active for receiving RF signals or to become inactive.

In addition to carrying a portion of the LO signal, signal line 92 of transmission line 88 is also configured to transmit a DC bias signal to pre-amplifier module 64. Signal line 92 is coupled to a DC bias circuit or fourth filter 106 of pre-amplifier module 64 configured to extract the DC bias signal from signal line 92 and to deliver, via an output 108 thereof, the DC bias signal to amplifier 74.

During operation, pre-amplifier module 64 receives an RF signal from RF coil 72 and the LO signal from transmission line 88. A mix of the RF signal and the LO signal via diode array 80 and transformer 78 results in a convolution of the spectrum of the LO signal ($\sin_{lo}$ and harmonics) with the spectrum of the RF signal ($\sin_{rf}$) to form an intermediate frequency (IF) signal having a frequency based on a difference between the frequency of the RF signal and the frequency of the LO signal. This balanced operation leaves no RF at the IF frequency but leaves sum and difference terms ($\sin_{lo-rf}$, $\sin_{lo+rf}$, $\sin_{3lo-rf}$, $\sin_{3lo+rf}$, etc). In general, the first order difference term is of interest. In the example above where the frequency of the LO signal is approximately 80 MHz and the frequency of the RF signal is approximately 64 MHz, mixing the RF signal and the LO signal in this manner results in a frequency of the IF signal of approximately 16 MHz. The IF signal is transmitted to transmission line 88 via common LO/IF port 86.

Figure 3:
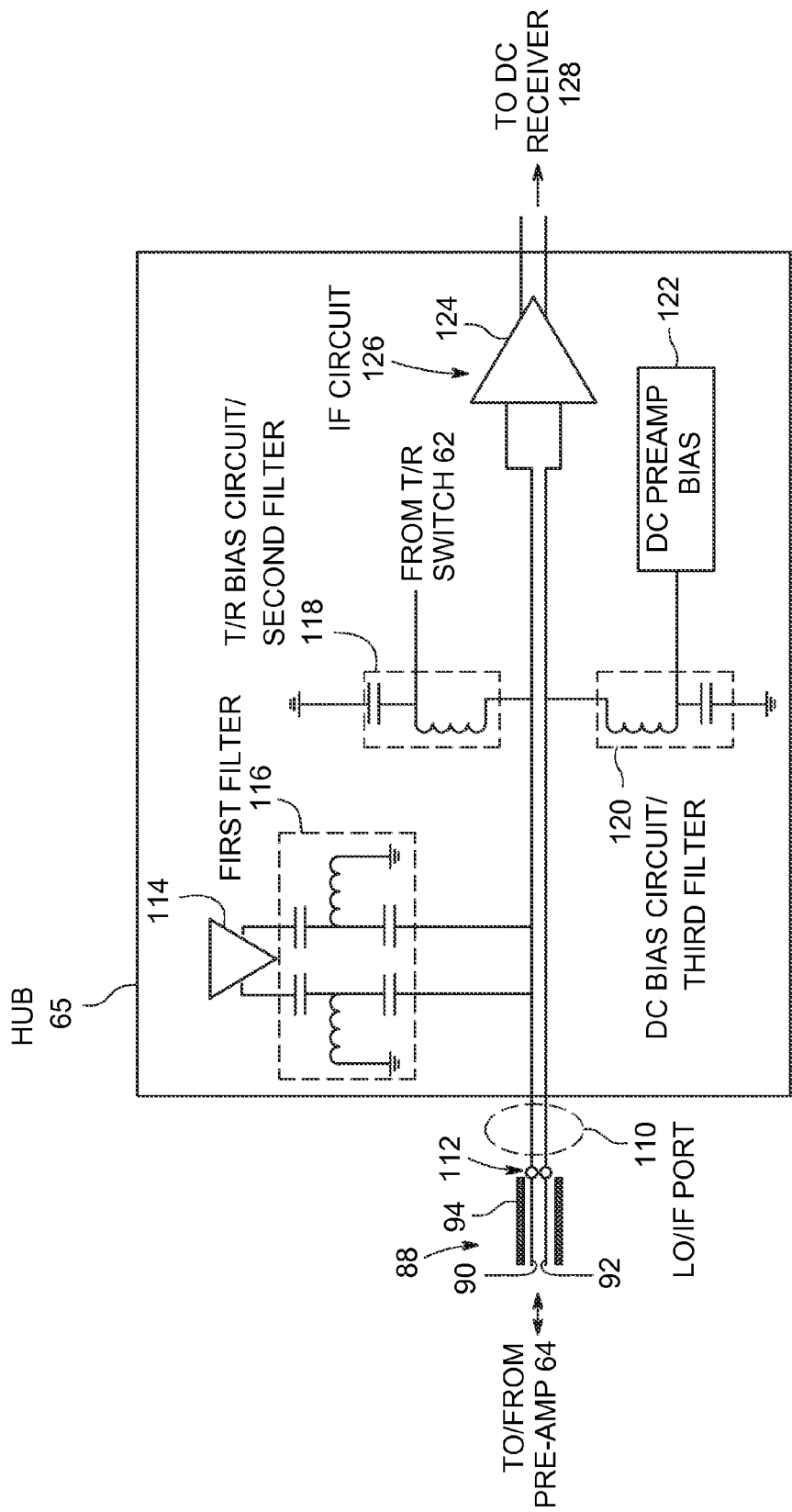
FIG. 3 is a block schematic diagram of hub 65 of FIG. 1 according to an embodiment of the invention.

FIG. 3 shows a block schematic diagram of hub 65 of FIG. 1 according to an embodiment of the invention. Hub 65 includes a common LO/IF port 110 coupled to transmission line 88. As shown, a fixed connection 112 may be used to couple common LO/IF port 110 with transmission line 88. In another embodiment, a quick-connect connector such as one similar to connector 96 of FIG. 2 may used.

Hub 65 includes a local oscillator (LO) circuit 114 coupled to signal lines 90, 92 of transmission line 88 for supplying the LO signal to pre-amplifier module 64. A first filter 116 may be configured to pass the frequency of the LO signal and to allow the mixer to see only the receiver load at the IF signal frequency. A T/R bias circuit or second filter 118 is coupled between signal line 90 and T/R switch 62 of FIG. 1 to insert the T/R bias signal onto signal line 90. A DC bias circuit or third filter 120 is coupled between signal line 92 and a DC preamp bias supply circuit 122 to insert the DC preamp bias signal onto signal line 92. As shown, hub 65 may include DC preamp bias supply circuit 122 for generating the DC preamp bias signal. In an alternative embodiment, the DC preamp bias signal may be controlled and delivered to hub 65 via system control 32 of FIG. 1.

The IF signal resulting from the mixing of the LO signal with the RF signal is transmitted to an amplifier 124 of an IF circuit 126 configured to amplify the IF signal. The amplified IF signal is then delivered to a IF receiver (shown in FIG. 4) such as the receiver section of the transceiver 58 of FIG. 1, for example.

According to embodiments of the invention, diode array 80, LO circuit 114, and IF circuit 126 form a commutating mixer. LO circuit 114 and IF circuit 126 are separated from diode array 80 by the twisted pair transmission line 88. Transmission line 88, which may be formed of a plurality of twisted pairs, allows hub 65 to be separated from pre-amplifier module 64 using a simplified cable system. In one embodiment, pre-amplifier module 64 may be positioned on one side of polarizing magnet 54 of FIG. 1, and hub 65 may be positioned on an opposite side of magnet 54. In this manner, transmission line 88 may pass through magnet 54 to couple pre-amplifier module 64 to hub 65.

Figure 4:
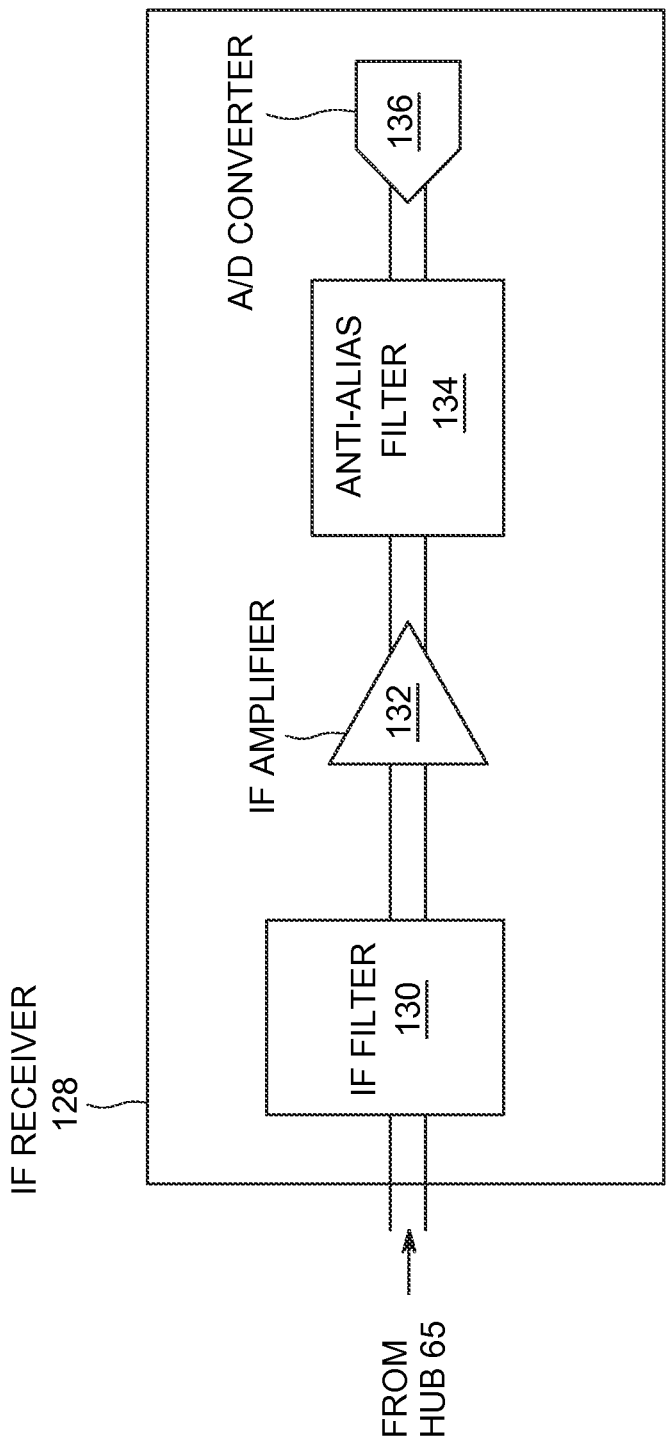
FIG. 4 is a block schematic diagram of a IF receiver for digitizing the analog IF signal according to an embodiment of the invention.

FIG. 4 shows a block schematic diagram of a IF receiver 128 for digitizing the analog IF signal according to an embodiment of the invention. IF receiver 128 may separate from transceiver 58 or may be a part thereof. IF receiver 128 includes an IF filter 130 coupled to receive the IF signal from hub 65. IF filter 130 delivers the filtered IF signal to an IF amplifier 132, which amplifies the IF signal and delivers the amplified IF signal to an anti-alias filter 134. An A/D converter 136 then converts the analog IF signal to a digital IF signal. The digitized IF signal may then be stored or reconstructed into an image according to the MR scan protocol.

Therefore, according to an embodiment of the invention, an MRI apparatus includes an RF coil, a preamplifier module, and a hub coupled to the preamplifier module via a transmission line. The preamplifier module includes an amplifier configured to amplify a magnitude of a first signal from the RF coil, the first signal having a first frequency and a diode array coupled to the amplifier. The MRI apparatus also includes an intermediate frequency (IF) circuit coupled to the transmission line and an oscillator circuit coupled to the hub and configured to supply an oscillating signal to the diode array via the transmission line to cause the diode array to mix the oscillating signal with the first signal to generate an IF signal to be received by the IF circuit via the transmission line, wherein the IF signal has a second frequency that is lower than the first frequency.

According to another embodiment of the invention, a method of manufacturing a balanced mixer for an MRI system includes forming an RF preamplifier module comprising an RF amplifier and a diode array, coupling the RF amplifier to an RF coil, the RF amplifier configured to amplify a magnitude of a signal having a first frequency from the RF coil, and coupling the diode array coupled to the amplifier. The method also includes coupling a transmission line to the RF preamplifier module and coupling a hub to the transmission line. The method further includes coupling an oscillator circuit to the hub and coupling an intermediate frequency (IF) circuit to the transmission line. The IF circuit is configured to receive the IF signal. the oscillator circuit configured to supply an oscillating signal to the diode array via the transmission line to cause the diode array to mix the oscillating signal with the first signal to generate an IF signal having a second frequency that is lower than the first frequency.

According to yet another embodiment of the invention, a magnetic resonance imaging (MRI) system includes a plurality of gradient coils positioned about a bore of a magnet, an RF coil assembly comprising a plurality of RF coils, a pulse module, and an RF transceiver system and an RF switch controlled by the pulse module to transmit RF signals to an RF coil assembly to acquire MR images. The MRI system further includes a preamplifier module coupled to the RF coil assembly and a transmission line coupled to the preamplifier module at a first end thereof and coupled to a hub at a second end thereof. The preamplifier module includes an amplifier configured to amplify a signal from the RF coil assembly and a diode array coupled to receive the amplified signal from the amplifier. The MRI system also includes an intermediate frequency (IF) circuit coupled to the transmission line and an oscillator circuit coupled to the transmission line and configured to supply an oscillating signal to the diode array via the transmission line to cause the diode array to mix the oscillating signal with the amplified signal to generate an IF signal to be received by the IF circuit via the transmission line, wherein the IF signal has a frequency that is lower than the amplified frequency.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A magnetic resonance imaging (MRI) Balanced Mixer apparatus comprising:
   an RF coil;
   a preamplifier module comprising:
      an amplifier configured to amplify a magnitude of a first signal from the RF coil, the first signal having a first frequency; and
      a diode array coupled to the amplifier;
   a transmission line;
   a hub coupled to the preamplifier module via the transmission line;
   an intermediate frequency (IF) circuit coupled to the transmission line; and
   an oscillator circuit coupled to the hub and configured to supply an oscillating signal to the diode array via the transmission line in order to cause the diode array to mix the oscillating signal with the first signal and configured to generate an IF signal to be received by the IF circuit via the transmission line, wherein the IF signal has a second frequency that is lower than the first frequency;
   wherein the transmission line connects each of the preamplifier module, the hub, the IF circuit and the oscillator circuit together.

2. The MRI apparatus of claim 1 wherein the transmission line comprises:
   a pair of signal lines; and
   a common shield line surrounding the pair of signal lines.

3. The MRI apparatus of claim 2 wherein the pair of signal lines forms a twisted pair.

4. The MRI apparatus of claim 2 wherein the hub further comprises a first transmit/receive (TR) bias circuit configured to supply a TR bias signal to a first signal line of the pair of signal lines; and
   wherein the preamplifier module comprises a second TR bias circuit configured to receive the TR bias signal from the first signal line and configured to supply the TR bias signal to the RF coil.

5. The MRI apparatus of claim 4 wherein the hub further comprises a first preamplifier DC bias circuit configured to supply a preamplifier DC bias signal to a second signal line of the pair of signal lines; and
   wherein the preamplifier module comprises a second preamplifier DC bias circuit configured to receive the preamplifier DC bias signal from the second signal line and configured to supply the preamplifier DC bias signal to the amplifier.

6. The MRI apparatus of claim 2 further comprising a quick-connect connector assembly coupled to the transmission line, wherein the quick-connect connector assembly comprises a pair of connectors configured to couple the hub to the preamplifier module when mated together and also configured to decouple the hub from the preamplifier module when disconnected from each other.

7. The MRI apparatus of claim 1 wherein the preamplifier module further comprises a transformer coupled between the amplifier and the diode array and configured to isolate the diode array from the amplifier.

8. The MRI apparatus of claim 1 wherein the oscillator circuit is configured to supply the oscillating signal at a third frequency, wherein the second frequency is based on a difference between the first and third frequencies.

9. The MRI apparatus of claim 8 wherein the oscillator circuit comprises a filter circuit configured to pass the third frequency from the oscillator circuit to the transmission line and to block the second frequency from the transmission line to the oscillator circuit.

10. The MRI apparatus of claim 1 wherein the diode array, the IF circuit, and the oscillator circuit form a commutating mixer.

11. The MRI apparatus of claim 1 wherein the diode array comprises four diodes coupled together in a bridge configuration.

12. A method of manufacturing a balanced mixer for an MRI system comprising:
   forming an RF preamplifier module comprising an RF amplifier and a diode array;
   coupling the RF amplifier to an RF coil, the RF amplifier configured to amplify a magnitude of a signal having a first frequency from the RF coil;
   coupling the diode array to the amplifier;
   coupling a transmission line to the RF preamplifier module;
   coupling a hub to the transmission line;
   coupling an oscillator circuit to the hub, the oscillator circuit configured to supply an oscillating signal to the diode array via the transmission line to cause the diode array to mix the oscillating signal with the first signal to generate an IF signal having a second frequency that is lower than the first frequency; and
   coupling an intermediate frequency (IF) circuit to the transmission line, the IF circuit configured to receive the IF signal;
   wherein the transmission line couples each of the RF preamplifier module, the hub, the IF circuit and the oscillator circuit together.

13. The method of claim 12 wherein coupling the transmission line to the RF preamplifier module comprises coupling a transmission line comprising:
   a twisted pair of signal lines; and
   a common shield line surrounding the twisted pair of signal lines.

14. The method of claim 13 further comprising:
   coupling a first transmit/receive (TR) bias circuit filter to a first end of a first signal line of the twisted pair of signal lines, the first TR bias circuit filter configured to supply a TR bias signal;
   coupling a second TR bias circuit filter to a second end of the first signal line, the second TR bias circuit filter being configured to receive the TR bias signal from the first TR bias circuit filter and configured to supply the TR bias signal to the RF coil;
   wherein the first end of the first signal line is positioned closer to the hub than to the RF preamplifier module; and
   wherein the second end of the first signal line is positioned closer to the RF preamplifier module than to the hub.

15. The method of claim 14 further comprising:
   coupling a first preamplifier DC bias circuit filter to an first end of a second signal line of the twisted pair of signal lines, the first preamplifier DC bias circuit filter being configured to supply a preamplifier DC bias signal;

coupling a second preamplifier DC bias circuit filter to an second end of the second signal line, the second preamplifier DC bias circuit filter being configured to receive the preamplifier DC bias signal from the second signal line and configured to supply the preamplifier DC bias signal to the amplifier;

wherein the first end of the second signal line is positioned closer to the hub than to the RF preamplifier module; and wherein the second end of the second signal line is positioned closer to the RF preamplifier module than to the hub.

16. A magnetic resonance imaging (MRI) system comprising:
a plurality of gradient coils positioned about a bore of a magnet;
an RF coil assembly comprising a plurality of RF coils;
a pulse module;
an RF transceiver system and an RF switch controlled by the pulse module in order to transmit RF signals to an RF coil assembly and in order to acquire MR images;
a preamplifier module coupled to the RF coil assembly and comprising:
an amplifier configured to amplify a signal from the RF coil assembly; and
a diode array coupled to receive the amplified signal from the amplifier;
a transmission line coupled to the preamplifier module at a first end thereof and coupled to a hub at a second end thereof;
an intermediate frequency (IF) circuit coupled to the transmission line; and
an oscillator circuit coupled to the transmission line and configured to supply an oscillating signal to the diode array via the transmission line in order to cause the diode array to mix the oscillating signal with the amplified signal and to also generate an IF signal that is received by the IF circuit via the transmission line, wherein the IF signal has a frequency that is lower than the amplified frequency; and wherein the transmission line couples each of the RF preamplifier module, the hub, the IF circuit and the oscillator circuit together.

17. The MRI system of claim 16 wherein the transmission line comprises a common port configured for transmission of the oscillating signal into the preamplifier module and configured for transmission of the IF signal into the IF circuit.

18. The MRI system of claim 16 wherein the transmission line comprises
a twisted pair of signal lines configured to transmit the oscillating signal and the IF signal.

19. The MRI apparatus of claim 18 wherein the MRI system further comprises
a first transmit/receive (TR) bias circuit configured to supply a TR bias signal to a first signal line of the twisted pair of signal lines; and
wherein the preamplifier module comprises
a second TR bias circuit configured to receive the TR bias signal from the first signal line and configured supply the TR bias signal to one of the RF coils.

20. The MRI apparatus of claim 19 wherein the MRI system further comprises a first preamplifier DC bias circuit configured to supply a preamplifier DC bias signal to a second signal line of the twisted pair of signal lines; and
wherein the preamplifier module comprises a second preamplifier DC bias circuit configured to receive the preamplifier DC bias signal from the second signal line and configured supply the preamplifier DC bias signal to the amplifier.

* * * * *

UNITED STATES PATENT AND TRADEMARK OFFICE
CERTIFICATE OF CORRECTION

PATENT NO. : 9,013,187 B2  Page 1 of 1
APPLICATION NO. : 13/161657
DATED : April 21, 2015
INVENTOR(S) : Stormont It is certified that error appears in the above-identified patent and that said Letters Patent is hereby corrected as shown below:

In the Claims

Col. 8, line 52 (Claim 14), delete "filter configured" and substitute therefore -- filter being configured --.

Col. 10, line 24 (Claim 19), delete "and configured" and substitute therefore -- and configured to --; and Col. 10, line 33 (Claim 20), delete "configured supply," and substitute therefore -- configured to supply --.

Signed and Sealed this
Twenty-second Day of September, 2015

Michelle K. Lee
*Director of the United States Patent and Trademark Office*